(12) United States Patent
Otsuka et al.

(10) Patent No.: US 11,372,442 B2
(45) Date of Patent: Jun. 28, 2022

(54) VEHICLE CONTROL SYSTEM VALIDATION TECHNIQUE AND VALIDATION DEVICE, AND CONTROL DEVICE

(71) Applicant: Hitachi Automotive Systems, Ltd., Hitachinaka (JP)

(72) Inventors: Satoshi Otsuka, Tokyo (JP); Kohei Sakurai, Hitachinaka (JP); Fumio Narisawa, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 174 days.

(21) Appl. No.: 16/604,980

(22) PCT Filed: Apr. 12, 2018

(86) PCT No.: PCT/JP2018/015329
§ 371 (c)(1),
(2) Date: Oct. 11, 2019

(87) PCT Pub. No.: WO2018/198783
PCT Pub. Date: Nov. 1, 2018

(65) Prior Publication Data
US 2021/0165444 A1 Jun. 3, 2021

(30) Foreign Application Priority Data
Apr. 27, 2017 (JP) .............................. JP2017-087824

(51) Int. Cl.
*G06F 1/14* (2006.01)
*H04L 12/40* (2006.01)
(Continued)

(52) U.S. Cl.
CPC ............ *G06F 1/14* (2013.01); *G06F 30/3312* (2020.01); *H04L 12/40* (2013.01); *H04L 2012/40273* (2013.01)

(58) Field of Classification Search
CPC ................................... G06F 1/14; H04L 12/40
See application file for complete search history.

(56) References Cited

U.S. PATENT DOCUMENTS 5,581,738 A * 12/1996 Dombrowski .......... G06F 30/33
716/104
6,396,814 B1 * 5/2002 Iwamura ............... H04L 12/185
370/235
(Continued)

FOREIGN PATENT DOCUMENTS

JP H10-340292 A 12/1998
JP 2006-012008 A 1/2006
(Continued)

OTHER PUBLICATIONS

International Search Report with English translation and Written Opinion issued in corresponding application No. PCT/JP2018/015329 dated Jul. 31, 2018.

*Primary Examiner* — Jaweed A Abbaszadeh
*Assistant Examiner* — Cheri L Harrington
(74) *Attorney, Agent, or Firm* — Foley & Lardner LLP (57) ABSTRACT

In the present invention, control feasibility in a vehicle control system architecture is efficiently determined by performing determination based on control feasibility in a physical element based on a converted parameter when a logical architecture is arranged in a physical architecture. The present invention includes: an arrangement unit 101 that arranges a logical architecture 601, which includes a linkage of each of logical functions and an execution time constraint of the linkage, in a physical architecture 300; a delay time calculation unit 104 that calculates a processing delay time based on a converted parameter when the logical architecture 601 is arranged in the physical architecture 300; and a (Continued)

verification unit 102 that verifies whether a total of the processing delay time satisfies the execution time constraint.

4 Claims, 10 Drawing Sheets

(51) Int. Cl.
*G06F 30/33* (2020.01)
*G06F 30/3312* (2020.01)

(56) References Cited

U.S. PATENT DOCUMENTS

| | | | |
|---|---|---|---|
| 6,453,451 B1* | 9/2002 | Lakshmanan | G06F 30/33 |
| | | | 716/102 |
| 10,607,039 B1* | 3/2020 | Kinderman | G05B 17/02 |
| 2003/0051222 A1* | 3/2003 | Williams | G06F 30/394 |
| | | | 716/113 |
| 2004/0123249 A1* | 6/2004 | Sato | G06F 30/33 |
| | | | 716/108 |
| 2005/0289492 A1 | 12/2005 | Goko | |
| 2008/0228460 A1* | 9/2008 | Lin | G06F 30/3312 |
| | | | 703/14 |
| 2016/0321037 A1 | 11/2016 | Ono | |
| 2018/0181397 A1* | 6/2018 | Ostanevich | G06F 9/3855 |

FOREIGN PATENT DOCUMENTS

| | | |
|---|---|---|
| JP | 2014-102734 A | 6/2014 |
| JP | 2016-207166 A | 12/2016 |
| WO | WO-2016/017111 A1 | 2/2016 |
| WO | WO-2016/017560 A1 | 2/2016 |

* cited by examiner

| COMPUTATION PERFORMANCE [MHz] |
| --- |
| RAM CAPACITY [KB] |
| ROM CAPACITY [KB] |
| APPLICABLE SAFETY LEVEL |
| COST [yen] |
| MULTIPLICITY |
| FAILURE RATE |
| DIAGNOSIS RATE |
| PHYSICAL DEPENDENCE |

B

| COMMUNICATION SPEED [bps] |
| --- |
| COST [yen] |
| MULTIPLICITY |

| LOGICAL FUNCTION TYPE |
|---|
| EXECUTION TIME @ EXECUTION ENVIRONMENT (OPTIMISTIC, PESSIMISTIC) |
| CONTROL PERIOD [s] |
| PRIORITY |
| CONSUMED RAM [KB] |
| CONSUMED ROM [KB] |

B

| LOGICAL FUNCTION TYPE |
|---|
| EXECUTION TIME @ EXECUTION ENVIRONMENT (OPTIMISTIC, PESSIMISTIC) |
| CONTROL PERIOD [s] |
| PRIORITY |
| CONSUMED RAM [KB] |
| CONSUMED ROM [KB] |
| REQUIRED SAFETY LEVEL |
| INDEPENDENCE REQUIREMENT |

C

| COMMUNICATION AMOUNT |
|---|

| ID | TYPE | CONSTRAINT TIME | FUNCTION PATH | | | | | | | | | |
|----|------|-----------------|---|---|---|---|---|---|---|---|---|---|
| 1 | NF | 100ms | 6 | L1 | 602 | L2 | 603 | L3 | 608 | L4 | 609 | L5 | 5 |
| 2 | SM | 50ms | 603 | L6 | 607 | L7 | 610 | L8 | 608 | | | |
| 3 | SM | 50ms | 6 | L9 | 610 | L10 | 608 | | | | | |
| ... | | | | | | | | | | | | |

FIG. 11

| TYPE | SCORE | | |
|------|-------|---|---|
| | PHYSICAL ELEMENT A | PHYSICAL ELEMENT B | ... |
| NORMAL CONTROL | Score_A1 | Score_B1 | ... |
| HIGH-PRECISION COMPUTATION | Score_A2 | Score_B2 | ... |
| LARGE-CAPACITY DATA COMPUTATION | Score_A3 | Score_B3 | ... |
| ... | ... | ... | ... |

| PHYSICAL ELEMENT NAME | CONNECTION DESTINATION NW | PHYSICAL PARAMETER |
|---|---|---|
| XXX | NW_A | .... |
| YYY | NW_A, NW_B | .... |
| ZZZ | NW_B, NW_C | .... |
| WWW | XXX | .... |

B

| ID | ARRANGEMENT LOCATION | LOGICAL PARAMETER |
|---|---|---|
| AAA | XXX | .... |
| BBB | YYY | .... |
| CCC | YYY | .... |
| DDD | XXX | .... |
| EEE | ZZZ | .... |

VEHICLE CONTROL SYSTEM VALIDATION TECHNIQUE AND VALIDATION DEVICE, AND CONTROL DEVICE

TECHNICAL FIELD

The present invention relates to a vehicle control system verification method and verification device, and a control device.

BACKGROUND ART

One of background art in this technical field is JP 2006-012008 A (PTL 1). An object of this publication is to "provide a method of efficiently performing LSI designing including a functional block using two kinds of timing models of an ideal clock condition and a propagation clock condition". As a solution, described is an "LSI designing method using a functional block having a plurality of flip flops, the LSI designing method including: a step of preparing a timing model being configured to be used under a first mode and a second mode; a step of performing functional design of functional elements each including one or a plurality of functional blocks; a step of conducting logic composition using the timing model of the functional block under the first mode with respect to the functional element obtained by the functional design; a step of performing first timing analysis using the timing model under the first mode with respect to the functional element that has been subjected to the logic composition; a step of performing a layout based on a result of said the logic composition and the first timing analysis; and a step of performing second timing analysis using the timing model under the second mode after performing the layout".

In addition, another background art in this technical field is JP H10-340292 A (PTL 2). An object of this publication is to "provide a layout method for shortening a design time by reducing repeated flow of layout design including logic design that is generated to satisfy a timing constraint in design of a semiconductor integrated circuit". As a solution, it is described that "when cells as units of logical functions, the cell constituted by a plurality of transistors, are arranged on a base substrate and a layout of a semiconductor integrated circuit that connects the cells by a signal wiring is performed, a wiring improvement process and a cell replacement process of replacing a cell with a logically equivalent cell having a different driving capability are automatically selected and executed, in consideration of the degree to which a delay time margin increases and an increase in density, for a cell forming a signal path sequence having no or little delay time margin for a given maximum delay time requirement during the arrangement process.

CITATION LIST

Patent Literature

PTL 1: JP 2006-012008 A
PTL 2: JP H10-340292 A

SUMMARY OF INVENTION

Technical Problem

In the above background art, a method of calculating a delay time when a logical function is arranged in a physical element, a method of automatically selecting an improved portion, and the like are described. However, there is no statement for an efficient computation method required when selecting many candidates for function arrangement, and the like. Further, there is no description on use of different determination methods for a function that is indispensable as a system, such as a safety function, and the other functions.

In particular, regarding control feasibility, it is necessary to select and design an architecture that satisfies the control feasibility from among countless combinations in optimum design and optimum layout of a logical architecture and a physical architecture. In such a case, it takes a lot of computation time for one combination in a content of verifying many combinations and operation patterns by performing simulation on an operation of each logical function on the physical element so that there is a problem that the time required for the optimum design increases.

The present invention has been made in view of the above circumstance, and provides a system that realizes an efficient control feasibility determination method when a logical function is arranged in a physical element and a determination method to satisfy a requirement relating to safety.

Solution to Problem

In order to solve the above problem, one embodiment of the present invention preferably uses, for example, the technical idea to be described in the claims.

Advantageous Effects of Invention

According to the present invention, it is possible to provide the system that realizes the efficient control feasibility determination method when the logical function is arranged in the physical element and the determination method to satisfy the requirement relating to safety.

DESCRIPTION OF EMBODIMENTS

Hereinafter, examples (embodiments) of preferred embodiments of the present invention will be described. The present embodiments mainly describe a verification device of a vehicle control system and are suitable for implementation in verification of a vehicle system, but do not hinder other applications.

First Embodiment

<Vehicle Control System Verification Device>

Figure 1:
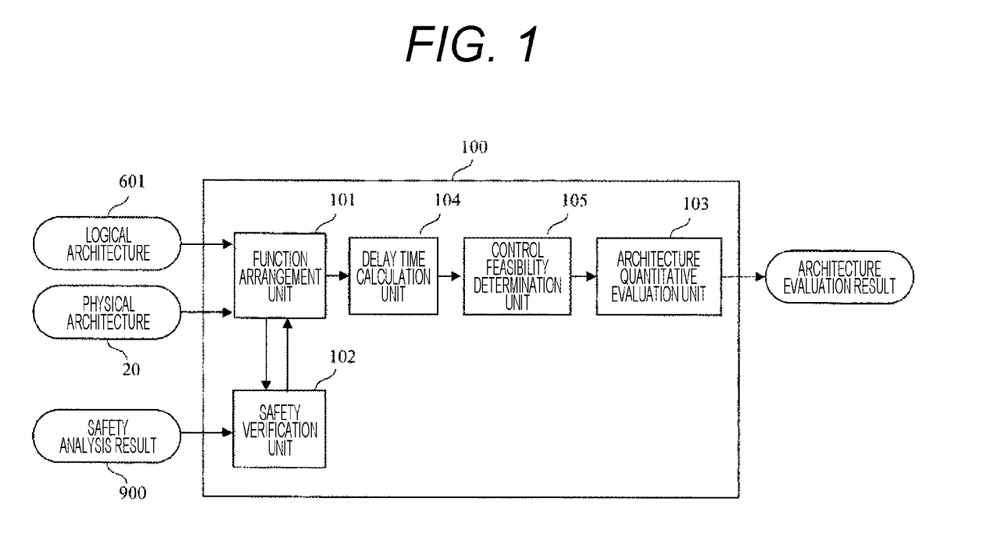
FIG. 1 is a vehicle control system verification device.

The entire vehicle control system verification device is illustrated in FIG. 1. A vehicle control system verification device 100 includes a function arrangement unit 101, a safety verification unit 102, an architecture quantitative evaluation unit 103, a delay time calculation unit 104, and a control feasibility determination unit 105.

The function arrangement unit (arrangement unit) 101 receives a logical architecture 601 and a physical architecture 2 as inputs, and arranges the logical architecture on the physical architecture as in an example of function arrangement.

The safety verification unit (verification unit) 102 receives the architecture after having been subjected to the function arrangement and parameters thereof as inputs, follows safety verification flow to verify the safety, and outputs OK or NG for the safety verification and a reason for NG.

The architecture quantitative evaluation unit 103 receives the verification result, mainly evaluates an architecture whose safety has been verified as OK, and outputs the evaluation result. In this manner, the verification and evaluation of the vehicle control system are performed.

The delay time calculation unit 104 performs delay time calculation, which will be described later, based on information of the architecture determined to be OK particularly in the safety verification after the function arrangement. The control feasibility determination unit 105 determines control feasibility based on the calculation result of the delay time calculation unit 104 and the information of the architecture, and outputs OK or NG and the evaluation result thereof.

Contents of the logical architecture, the physical architecture, the function arrangement, and the safety verification will be described later.

<Configuration of Vehicle Control System>

Figure 2:
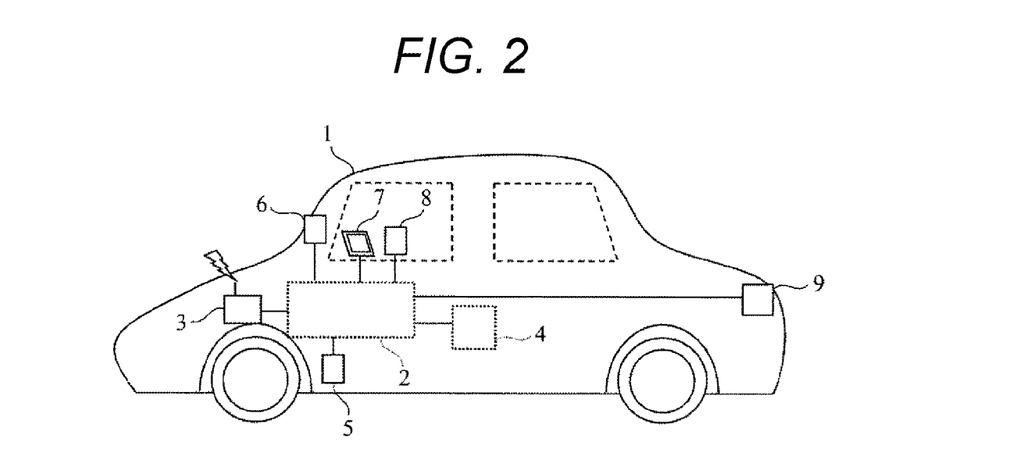
FIG. 2 is an example of a system.

A configuration of the vehicle control system that performs evaluation will be described. FIG. 2 is an outline of a vehicle system including a vehicle control system and a vehicle system having a vehicle control device. Each illustrated reference sign will be described hereinafter. Reference sign 1 represents the vehicle system including the vehicle control system therein, such as a car. Reference sign 2 represents a vehicle control system constituted by, for example, an in-vehicle network (CAN: Controller Area Network, CANFD: CAN with Flexible Data-rate, Ethernet (registered trademark), or the like) and a controller (ECU: Electronic Control Unit or the like). Reference sign 3 represents a communication device that performs wireless communication with the outside of the vehicle system 1 (for example, communication of a mobile phone, communication using protocol such as wireless LAN, WAN, and C2X (Car to X: vehicle-to-vehicle or vehicle-to-infrastructure communication), or communication using a global positioning system (GPS)), performs wireless communication such as acquisition and transmission of information on the external world (infrastructure, other vehicles, maps) or information on a host vehicle, or includes a diagnostic terminal (OBD), an Ethernet terminal, a terminal for an external recording medium (for example, a USB memory, an SD card, or the like), and the like to perform communication with the vehicle control system 2. Reference sign 4 represents a vehicle control system configured using a network that uses, for example, protocol different from or the same as the protocol of the vehicle control system 2. Reference sign 5 represents a drive device such as an actuator that drives a machine and an electric device (for example, an engine, a transmission, a wheel, a brake, a steering device, or the like) that controls vehicle motion under control of the vehicle control system 2. Reference sign 6 represents a recognition device constituted by an external sensor such as a camera, a radar, a LIDAR, and an ultrasonic sensor that acquires information input from the external world and outputs information to generate information and a dynamic system sensor that recognizes a state of the vehicle system 1 (a motion state, position information, an acceleration, a wheel speed, or the like). Reference sign 7 represents an output device, such as a liquid crystal display, a warning light, and a speaker, that is connected to a network system in a wired or wireless manner, receives data sent from the network system, and displays or outputs necessary information such as message information (for example, a video and a sound). Reference sign 8 represents an input device, such as a steering wheel, a pedal, a button, a lever, and a touch panel, configured to generate an input signal as a user inputs an operational intention or instruction to the vehicle control system 2. Reference sign 9 represents a notification device, such as a lamp, an LED, and a speaker, for the vehicle system 1 to notify the external world of the state of the vehicle and the like.

The vehicle control system 2 is connected to the other vehicle control system 4, the wireless communication unit 3, the drive device 5, the recognition device 6, the output device 7, the input device 8, the notification device 9, and the like to transmit and receive information.

<Physical Architecture>

Figure 3:
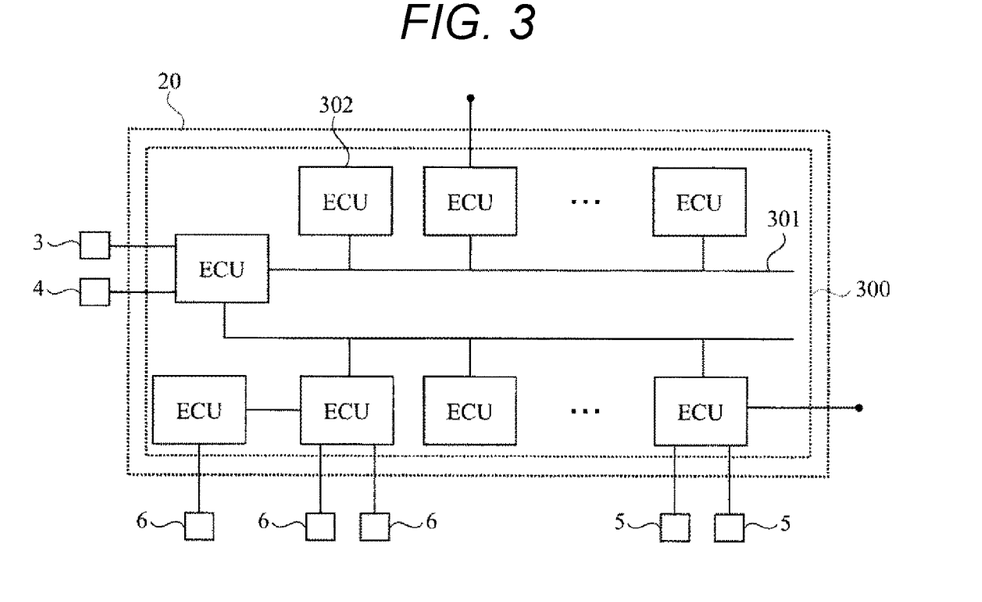
FIG. 3 is an example of a physical architecture.

FIG. 3 illustrates an example of the physical architecture of the vehicle control system 2. A physical architecture 300 is also referred to as a H/W (Hardware) configuration. Reference sign 301 represents a network link that connects network devices on the in-vehicle network, for example, a network link such as a CAN bus, and reference sign 302 represents an electronic control unit (ECU) that is connected to the network link 301, the drive device 5, and the recognition device 6 or a network link (including a dedicated line) other than the network link 301, and performs control of the drive device 5 and the recognition device 6, information acquisition, and transmission and reception of data with the network. The ECU connects a plurality of network links 301, and also plays a role of a gateway (hereinafter referred to as "GW") that transmits and receives data to and from each network link.

Examples of network topology include an example of a bus type illustrated in FIG. 3 in which a plurality of ECUs are connected to the two buses, and further, a star type in which a plurality of ECUs are connected directly to GW, a link type in which an ECU is connected to a series of links in a ring shape, a mixed type which is configured using a plurality of networks and in which the respective types are mixed, and the like. The ECU 302 performs control processing such as output of a control signal to the drive device 5, acquisition of information from the recognition device 6, output of a control signal and information to the network, and change of an internal state, based on data received from the network.

The ECU 302, the network 301, and a processor in the ECU will be hereinafter also referred to as "physical elements".

Figure 4:
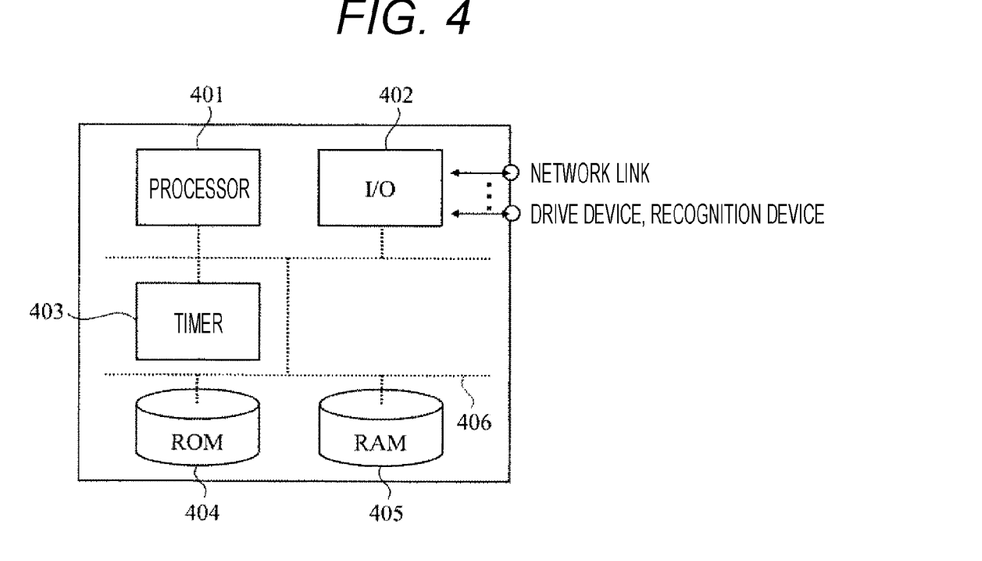
FIG. 4 is a configuration example of a controller.

FIG. 4 is an example of an internal configuration of the ECU 302. Reference sign 401 represents a processor (computation device) such as a CPU that includes, a storage element such as a cache and a register, and executes control, reference sign 402 represents input/output (I/O) that transmits and receives data to and from the drive device 5 and/or the recognition device 6 connected by the network link 301 or a network and a dedicated line, reference sign 403 represents a timer that manages time and timing using a clock (not illustrated), reference sign 404 represents a read only memory (ROM) storing a program and non-volatile data, reference sign 405 represents a random access memory (RAM) that stores a program and volatile data, and reference sign 406 represents an internal bus to be used for communication within the ECU. The processor 401 executes a logical function to be described later.

<Parameters of Physical Architecture>

Figure 5:
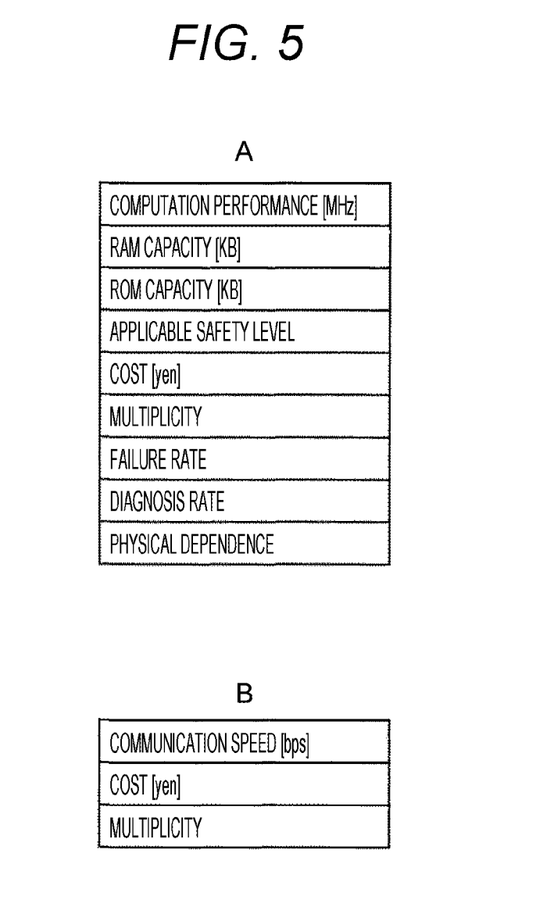
FIG. 5 is an example of parameters of the physical architecture.

Parameters assigned to the physical elements (the ECU and the processor) of the physical architecture are illustrated in FIG. 5A. The parameters include computation performance, RAM capacity, ROM capacity, and cost, and are used to evaluate the architecture.

A parameter relating to safety is a safety level that is applicable as hardware. Examples thereof include ASIL and QM. A multiplicity is set to, for example, two (the number of multiplicities) if it is applicable even to a failure of a single system failure with a dual system. A failure rate is input as a parameter to be used for safety verification of a failure probability of the physical element. A diagnosis rate indicates the coverage of diagnosis of a function (for example, microcomputer diagnosis or the like) of the physical element.

When a microcomputer is arranged inside the ECU, the parameters are given to either the ECU or the processor, and the parameters of one of the ECU and the processor are used. When the parameters are assigned to both the ECU and the microcomputer, parameters that produce worse results (for example, low values as the ASIL) for verification by taking into account safety so that a high verification result is not erroneously output, and the overall safety can be ensured.

In addition, parameters to be assigned to the network are illustrated in FIG. 5B. The network has the parameters of a communication speed, cost, and a multiplicity (communication line redundancy).

<Logical Architecture>

Figure 6:
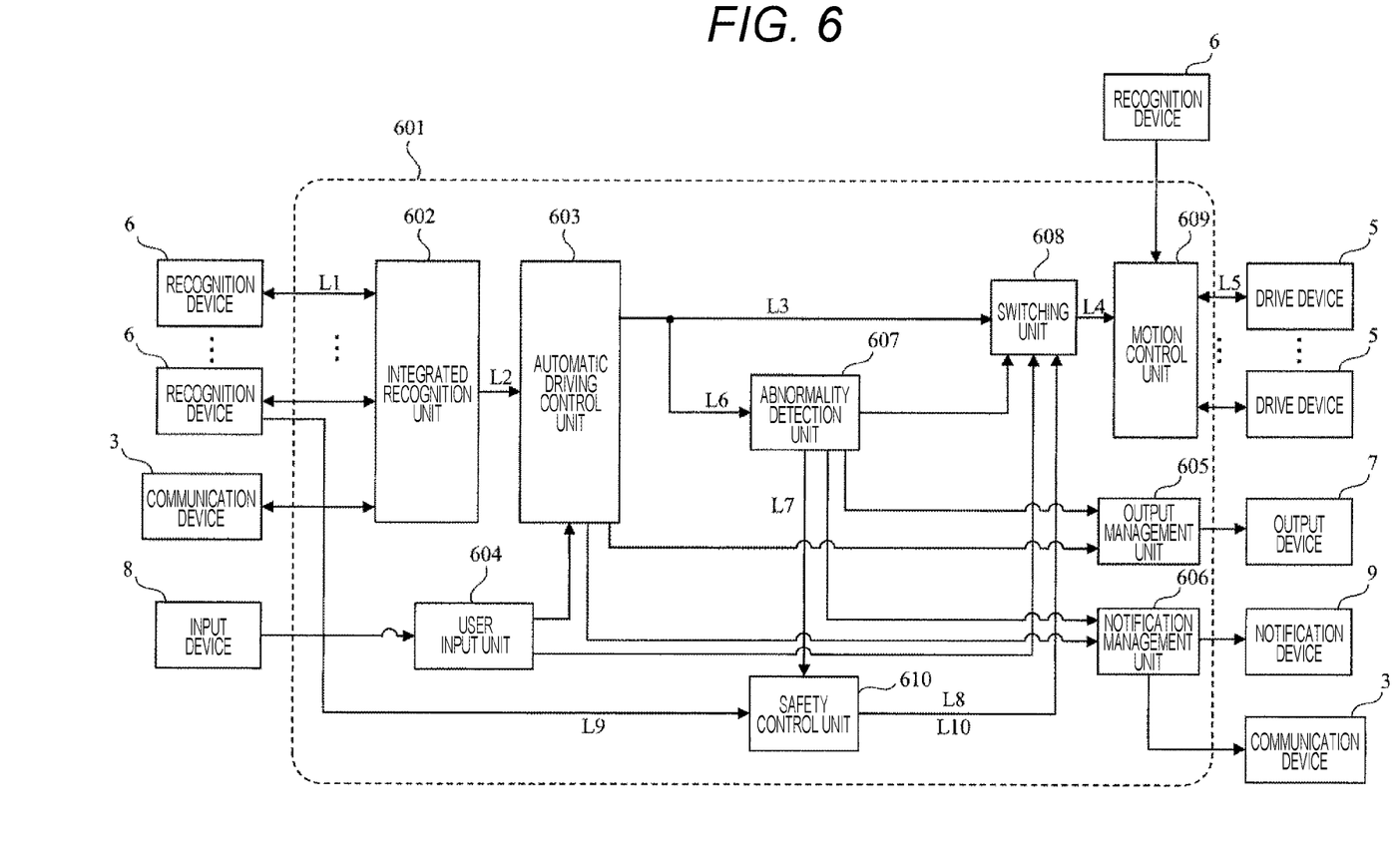
FIG. 6 is an example of a logical architecture.

An example of the logical architecture of the vehicle control system is illustrated in FIG. 6. Reference sign 601 illustrates the entire logical architecture of the vehicle control system. Reference sign 602 represents an integrated recognition unit that creates an external world recognition map in which pieces of external world recognition information output from a plurality of the recognition devices 6 and the communication devices 3 are integrated. Reference sign 603 represents an automatic operation control unit that performs generation and output of automatic operation control information (such as a trajectory), an output instruction to an output management unit 605, and a notification instruction to a notification management unit 606 with the external world recognition map generated by the integrated recognition unit 602 and a user input input from a user input unit 604. Reference sign 604 represents the user input unit that generates user's instruction information according to an input from the input device 8. Reference sign 605 represents the output management unit that issues an output instruction to the output device 7 according to outputs of the automatic operation control unit 603 and an abnormality detection unit 607. Reference sign 606 represents the notification management unit that issues a notification instruction to the notification device 9 according to the outputs of the automatic operation control unit 603 and the abnormality detection unit 607. Reference sign 607 represents the abnormality detection unit that detects an abnormality based on notification of automatic operation control information or the like from the automatic operation control unit 603 or notification from each unit (not illustrated). Reference sign 608 represents a switching unit that switches an output to a motion control unit 609 to the input from the automatic operation control unit 603, the input from the user input unit 604, or the input from a safety control unit 610, based on an abnormality detection result of the abnormality detection unit 607 and the like. Reference sign 609 represents the motion control unit that controls a plurality of the drive devices 5 in accordance with trajectory information or motion control information from the switching unit 608, a state of the vehicle system 1 acquired from the recognition device 6, and responses from the drive devices 5. Reference sign 610 represents the safety control unit that performs control when notification of abnormality detection is received.

In this example, functions that perform main control at normal time are referred to as main functions, and 602, 603, 604, 605, 606, and 609 correspond the main functions herein. In addition, functions that perform main control after abnormality detection and abnormality occurrence are referred to as safety functions, and 607, 608, and 610 correspond to the safety functions.

<Parameters of Logical Architecture>

Figure 7:
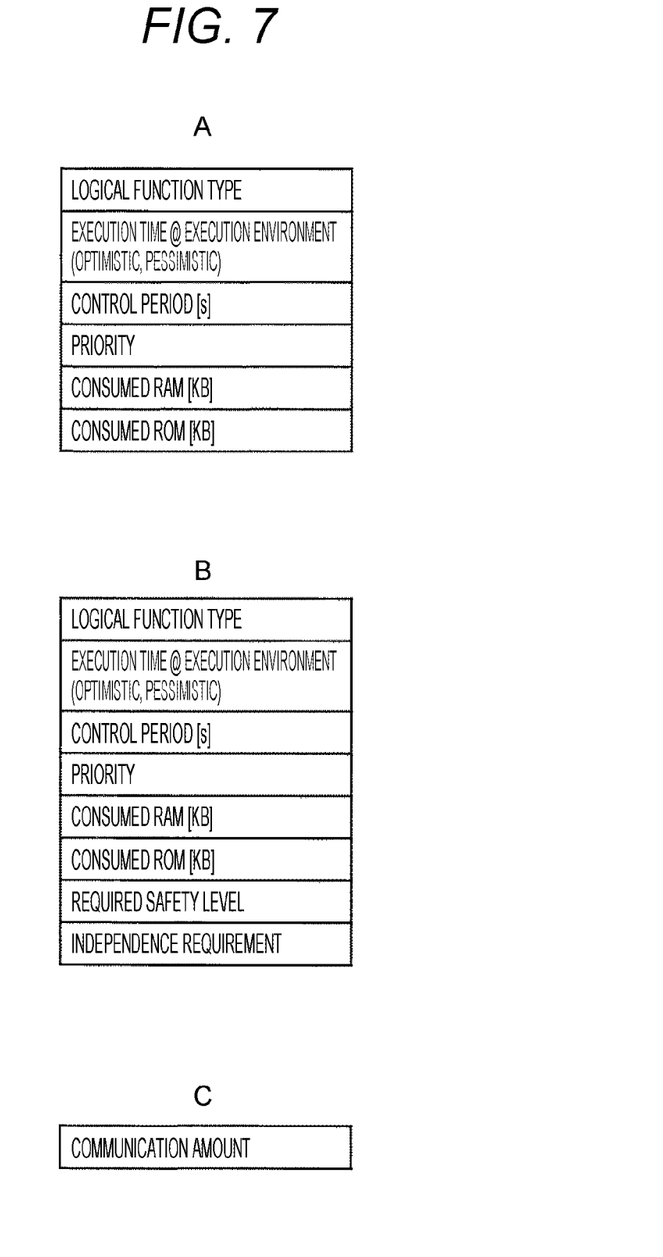
FIG. 7 is an example of parameters of the logical architecture.

Examples of parameters of the logical architecture is illustrated in FIG. 7. FIG. 7A illustrates parameters assigned to the main functions, a logical function type is used to determine the main functions and safety functions, and an execution time (in a certain execution environment), a control period (execution period), a function execution priority, consumed RAM, and consumed ROM are mainly used for architecture evaluation.

FIG. 7B illustrates parameters assigned to the safety functions, a logical function type, an execution time (in a certain execution environment), a control period, a function execution priority, consumed RAM, and consumed ROM are used in the same manner as in the main functions.

A required safety level is a safety level required for the corresponding safety function, and, for example, QM or ASIL is assigned, and the execution of the safety function with the corresponding safety level is required.

An independence requirement describes a logical function name of a function that should not simultaneously fail when a failure occurs regarding the corresponding safety function. This is a parameter, for example, configured to prevent design such as a common cause failure and a dependent failure, in which the safety function and the main function simultaneously fail, and as a result, safety control becomes impossible.

Regarding the execution time (in a certain execution environment), each logical function is held, as a parameter, for a time of execution in a particular execution environment. The execution environment is, for example, a type of a microcomputer, an operating frequency, and the like. Execution times in such execution environments are held, and the execution time at the time of physical arrangement is calculated. Thus, there is a possibility that a plurality of execution times are given for each of the execution environments. There are two types of execution time, optimistic or pessimistic execution time depending on a measurement method. For example, the optimistic execution time includes a mean, a mode, a median, and the like, the pessimistic execution time includes a worst value, a mean taking into account a margin and a safety level, and the like, and here, a pessimistic value is equal to or more than an optimistic value.

FIG. 7C illustrates parameters for a logical connection, and illustrates a communication amount on the corresponding communication path. This is used for an architecture quantitative evaluation.

<Function Arrangement Example>

Figure 8:
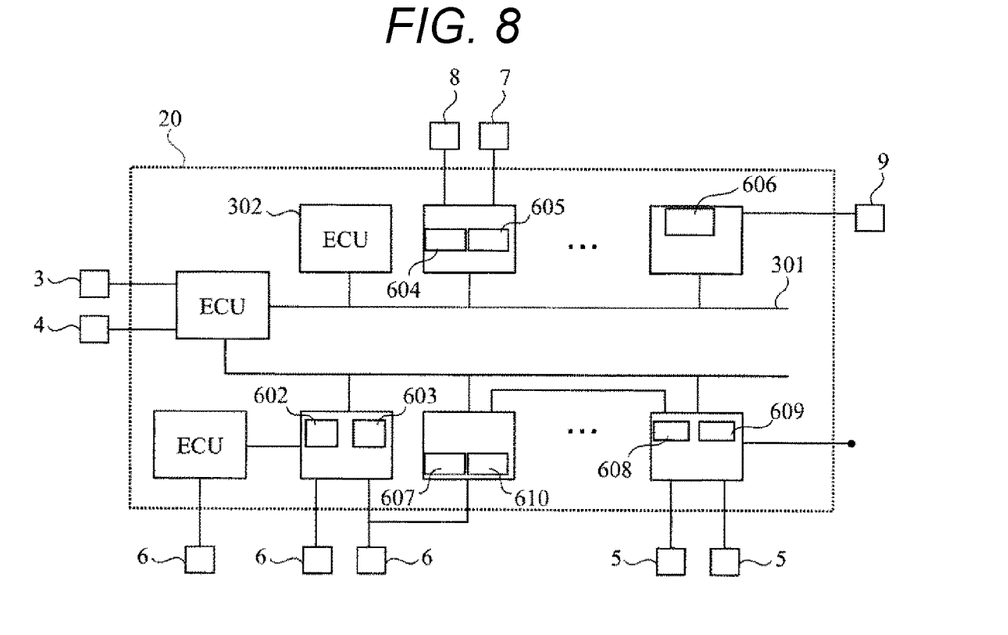
FIG. 8 is an example in which the logical architecture is arranged in the physical architecture.

An arrangement example of the logical architecture on the physical architecture is illustrated in FIG. 8. The logical functions on the logical architecture are arranged on the physical architecture in this manner. As a result, processing of which logical function is performed on which physical element (ECU or microcomputer) and what kind of data is processed in communication via the network are determined.

If there are a plurality of routes in the network between logical functions, efficient communication is performed by, for example, selecting a route having the lowest cost (a communication bandwidth or the number of hops) among the plurality of paths. Regarding the function arrangement, for example, the above-described logical architecture is exhaustively arranged with respect to the physical architecture. For example, all logical functions (La, Lb, Lc, ... ) of the logical architecture are arranged with respect to all elements (Pa, Pb, Pc, ... ) of the physical architecture in all combinations. For example, the arrangement is sequentially performed by first consolidating all the logical functions in Pa, and then, arranging only one logical function (for example, La) in Pb, and arranging all the others in Pa. As the arrangement is performed in all the combinations and each combination is evaluated, it is possible to select an optimal architecture.

<Safety Verification>

Figure 9:
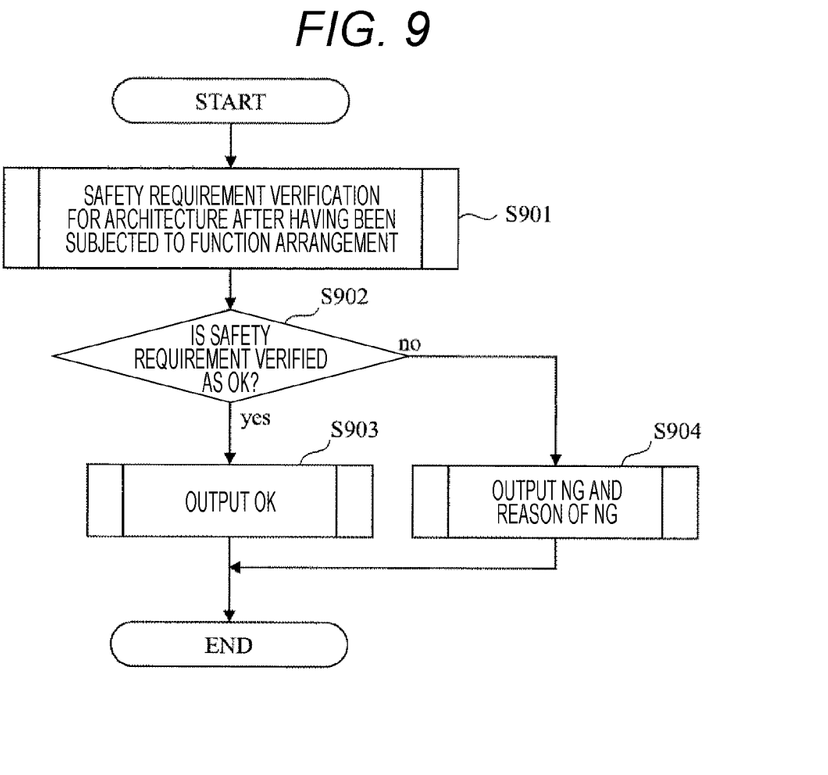
FIG. 9 is a processing flow of safety verification.

Processing flow of the safety verification is illustrated in FIG. 9. In the safety verification, safety requirement verification to be described later is first performed for the architecture after having been subjected to the function arrangement (S901). If a result of the safety requirement verification is OK (yes in S902), OK is output as a result and the processing is ended (S903). If the result of the safety requirement verification is NG (no in S902), the result of NG and any safety requirement that has been verified as NG are output. The safety verification is performed in this manner.

<Safety Requirement Verification>

In an example of safety requirement verification, it is determined whether the requirements for the safety level and the multiplicity are satisfied at an arrangement destination in the physical architecture of the corresponding safety function. In the case of the safety level, it is determined as OK when a value of a required safety level value in the parameter of the corresponding safety function is equal to or lower than an applicable safety level of a physical element at the arrangement destination. Specifically, when the required safety level of the safety function is ASIL-C, it is determined as OK when the applicable safety level of the physical element of the arrangement destination is ASIL-C or higher (ASIL-D or the like). In the case of the multiplicity, it is determined as OK when a value of the multiplicity in the parameter of the corresponding safety function is equal to or less than a multiplicity of the physical element at the arrangement destination. Specifically, if the multiplicity of the safety function is two, it is determined as OK when the multiplicity of the physical element of the arrangement destination is two or more. In this manner, the safety requirement verification is performed as a whole.

<Time Requirement>

Figure 10:
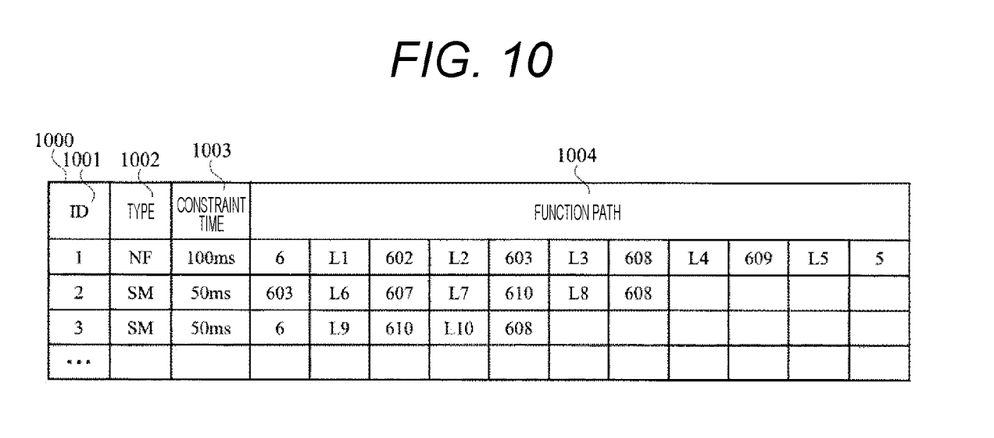
FIG. 10 is an example of a time requirement table.

An example of a time requirement assigned to the logical architecture is illustrated in FIG. 10. Here, reference sign 1000 represents the entire time requirement table, reference sign 1001 represents a requirement ID, reference sign 1002 represents a time requirement type, reference sign 1003 represents a constraint time, and reference sign 1004 represents a path of a logical function that requires a time requirement.

The requirement type is used, for example, to distinguish between the main function (NF) and the safety function (SM). The constraint time indicates a constraint of time from an input to an output for each time requirement, and indicates a constraint that the processing from the input to the output is performed within the constraint time.

Here, the function path indicates a function path to which the above time constraint is applied in the logical architecture 601. In the example of ID 1, function paths regarding a route are indicated such as a path from the recognition device 6 to the integrated recognition unit 602 via a logical path L1 (illustrated as 601), a path from the integrated recognition unit 602 to the automatic operation control unit 603 via a logical path L2, and so on. The above time constraint indicates a time constraint from the input of the recognition device 6 to the output of the drive device 5 via this function path in the example of ID 1.

<Delay Time Calculation>

Hereinafter, a description will be given regarding a method of calculating a delay time when a logical function is arranged in a physical element, the method performed by the delay time calculation unit 104.

In the first example, regarding the execution time of each logical function, a delay time for an execution time in computation performance (for example, an operating frequency: MHz) of a physical element is allocated to each logical function in advance, and recalculation is performed using a ratio with the computation performance of the physical element at the arrangement destination. For example, when an execution environment is computation performance 400 MHz of a physical element A and an execution time TA is 1 ms for a certain logical function, an execution time TB is set as follows in the case of arrangement in computation performance 800 MHz of another physical element B, $$TB = \frac{\text{Computation function of physical element } B}{\text{Computation function of physical element } A} \times TA = \quad \text{[Formula 1]}$$

$$0.5 \text{ ms}$$

In this manner, the delay time caused by the logical function is recalculated in the arrangement to the physical element having the different computation performance.

Figure 11:
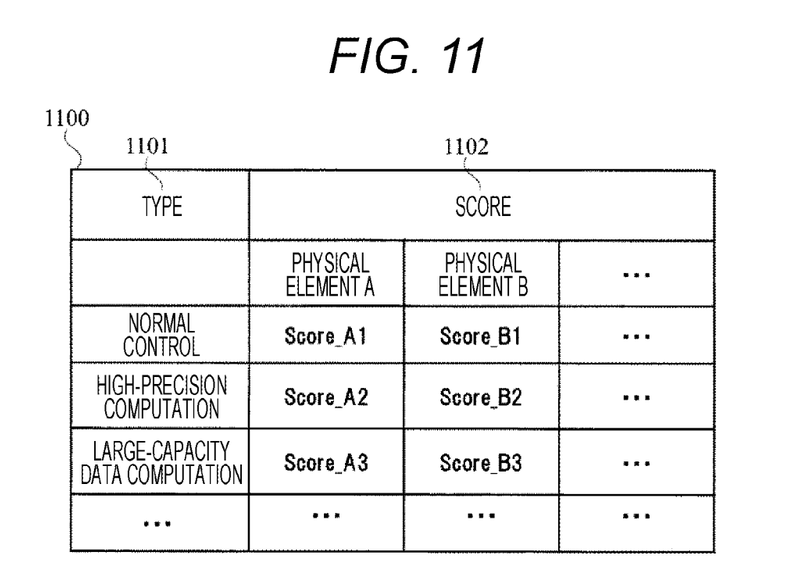
FIG. 11 is an example of a benchmark score.

In addition, in another example, a delay time is calculated based on a benchmark score in a processor of a physical element and a logical function type (for example, normal computation, high-precision computation, or large-capacity data computation). This is because a computation result of computation time varies depending on not only the operating frequency but also the type of the logical function to be executed and the configuration of the computation device inside the physical element (for example, the presence or absence of an accelerator for the high-precision computation in the processor of the physical element, the presence or absence of a data cache, or the like). The example of the benchmark score used in such a case is illustrated in FIG. 11.

Here, it is assumed that a benchmark score 1100 is provided for each type of logical function operated by the delay time calculation unit 104. For example, when an execution time in a physical element A is TA for a certain logical function, an execution time TB is set as follows in the case of arrangement in another physical element B.

[Formula 2]
$$TB = \frac{\text{Score of corresponding logical function type of processor of physical element } B}{\text{Score of corresponding logical function type of processor of physical element } A} \times TA$$

In addition, regarding the delay time in the network, the communication amount of the logical function defines a bit rate with respect to the computation performance of the network, and thus, a delay time TN in the network can be calculated as follows.

[Formula 3]
$$TN = \frac{\text{Bit rate } [bps]}{\text{Network bandwidth } [bps]}$$

<Control Feasibility Determination>

Next, a method of determining control feasibility performed by the control feasibility determination unit 105 will be described. Regarding the control feasibility, first, whether the total time constraint satisfies the total of delay times for each logical function is determined for the execution time (delay time) of the logical function that has been subjected to performance conversion, and then, whether an occupancy rate is equal to or less than a reference value is determined in the physical element for the logical function arranged in each physical element.

Whether the overall control feasibility is satisfied is determined as follows.

[Formula 4]

$$\text{Constraint time} > \sum_{\substack{Entire \\ computation \\ device}} (\text{MAX(Control period of logical function in computation device)} * 2) + \sum_{\substack{Entire \\ network}} (\text{Network delay time}) \quad (1)$$

Here, MAX indicates a function that returns the maximum value in parentheses. A reason why the computation in the computation device is set to twice the maximum value of a control period of a logical function in the computation device is because an input of data is received immediately after the logical function of 20 ms is started in the worst case, and it takes twice the period of 20 ms until the computation is performed based on the input data at the next start time, for example, when there are the logical functions whose control periods are 10 ms and 20 ms and the respective logical functions perform computation by receiving an input from the outside and perform output. For the logical function of 10 ms, when the following occupancy rate is calculated to be less than the reference value, it is considered that processing is performed during that period.

In addition, the delay time of the network is calculated by the following formula.

[Formula 5]
$$\text{Network delay time} = \frac{\text{Communication amount of logical function}}{\text{Communication speed of physical element}} \quad (2)$$

The above formula is a calculation formula in the case of efficient computation which does not take into account a collision and the like in a network. Regarding the network, a calculation formula of a network delay time considering the schedulability in the network as a network delay time when a plurality of pieces of data flow in the network is given as follows.

[Formula 6]
$$\text{Network delay time} = \frac{\text{Communication amount of logical function} + \text{Communication amount of another logical function of network}}{\text{Communication speed of physical element}} \quad (2)$$

Here, regarding the communication amount of the other logical function of the network, it is sufficient to add only the communication amount of the logical function having a high priority to the logical function that performs the calculation. For example, regarding the main function, safety can be easily ensured and simple calculation can be performed by adding only the safety function (having a higher priority).

Next, the occupancy rate in the physical element is calculated. A calculation formula is given as follows.

[Formula 7]
$$\text{Occupancy rate} = \sum_{logicalfunction} \frac{\text{Execution time in arrangement destination physical element}}{\text{Control period}} \quad (3)$$

Here, when the occupancy rate exceeds one or the following reference value, it is difficult to sufficiently execute the logical function as a system, and thus, it is determined as NG. For example, a reference value in system design (for example, 0.8 or less), a reference value based on the late monotonic scheduling calculation formula, or the like is defined in advance when the occupancy rate is one or less, and it is determined as OK if the occupancy rate is equal to or less than such a reference value.

When it is determined that the occupancy rate is equal to or less than the reference value for all the physical elements as a result of such determinations, it is determined that the above time requirement is satisfied.

Here, the order of determining the occupancy rate in the individual physical elements after calculating the overall control feasibility has been described, but the feasibility in the individual physical elements may be determined first. Then, it is possible to obtain a determination early from an evaluation in the case of design in which the occupancy rate in the individual physical elements is assumed to be severe.

<Architecture Quantitative Evaluation>

In the architecture quantitative evaluation, a quantitative evaluation is performed for an architecture whose safety verification result is OK in the architecture in which the function has been arranged. As a method of the quantitative evaluation, consumed RAM and consumed ROM of a plurality of logical functions arranged in physical elements of the physical architecture are summed up to calculate a use rate on the physical elements. In addition, regarding the communication, a usage of logical communication on the network is similarly summed up to calculate an occupancy rate. In addition, cost for the physical elements being used, that is, where one or more logical functions are arranged, in the entire physical architecture. The quantitative evaluation is possible with such calculations.

Figure 12:
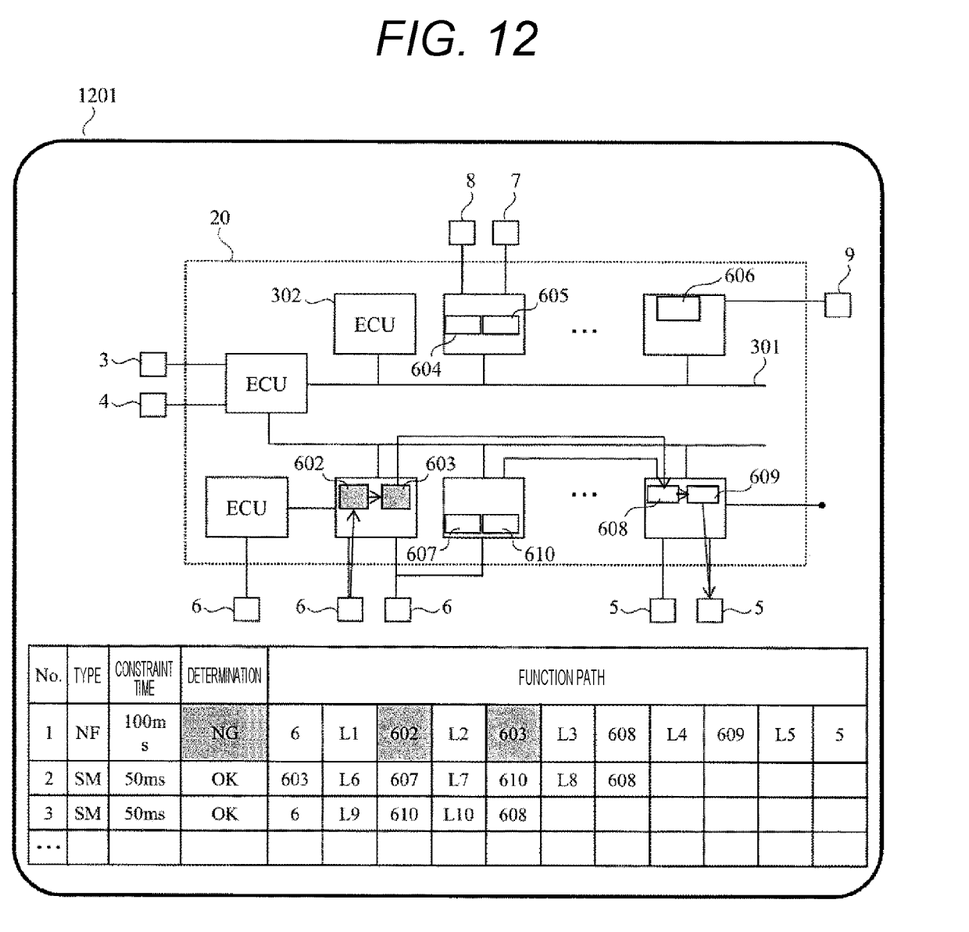
FIG. 12 is a display example of an architecture evaluation result according to a first embodiment of the present invention.

An example of an architecture evaluation result, particularly, a control feasibility evaluation result, is illustrated in FIG. 12. Here, as an example, an example of arranging the logical architecture in the physical architecture and an example of outputting the time requirement table 1000 to a screen and the like are illustrated. Here, an example in which the occupancy rate exceeds the reference value in the physical element in which the logical functions 602 and 603 are arranged, and as a result, the time constraint is not satisfied is illustrated. This example illustrates an example in which the time requirement that has not been satisfied and the arranged logical functions thereof are emphasized. Then, it is possible to confirm the element of the architecture that does not satisfy the control feasibility and the cause thereof.

Then, it is possible to evaluate the architecture while determining the control feasibility. In particular, it is possible to efficiently evaluate the control feasibility by addition of the assumed delay time in the system and simple evaluation of scheduling within the physical element to select and evaluate the architecture that satisfies the control feasibility without determining schedulability for all combinations.

Second Embodiment

Next, a description will be given regarding an embodiment in which control feasibility regarding a safety-related function is preferentially determined. A difference from the first embodiment is that the control feasibility determination unit 105 preferentially determines the safety-related function. Specifically, in the example of the time requirement described in FIG. 10, ID 2 and ID 3 which are safety-related functions are determined first, and a constraint time is preferentially determined over ID 1 which is the main function. Then, for example, the determination for an architecture that does not satisfy a time requirement of a safety function is ended at the time so that it is possible to reduce a determination time as compared with a case where the time of the main function is preferentially determined.

In addition, the safety function is also preferentially determined regarding the determination of control feasibility in a physical element. Here, "preferentially" means to calculate that an occupancy rate does not exceed a reference value even when a pessimistic execution time is used for an execution time of the safety-related function and an optimistic execution time is used for an execution time of the main function. A calculation formula in such a case is given as follows.

[Formula 8]

$$\text{Safety-function-prioritized occupancy rate} = \sum_{\text{Safety-related function}} \frac{\text{Pessimistic execution time}}{\text{Control period}} + \sum_{\text{main function}} \frac{\text{Optimistic execution time}}{\text{Control period}} \quad (4)$$

In general, a pessimistic execution time of a function A is longer than an optimistic execution time of the function A. It is possible to confirm that there are more pattern determined as OK as compared with the case of pessimistically evaluating the entire part and the execution of the safety function does not fail even with the pessimistic viewpoint by confirming that the occupancy rate determined in this manner is equal to or less than an allowable value.

Whether the logical function to be determined here is the safety function may be determined depending on not only use of a logical function type of a logical architecture parameter but also use of the logical function as a safety requirement input from a safety analysis result 900 or the like or a safety requirement output from the safety verification unit 102. Then, even when assigned as the safety function for the logical function type of the logical architecture parameter, a function that is not used as the safety function as a result of safety analysis is not determined as the safety function, and it is possible to perform the determination based on the safety analysis result.

Third Embodiment

Next, a description will be given regarding an embodiment in which information to facilitate improvement of an architecture is output as an architecture evaluation result.

First, an example of an improvement proposal for a control period will be described. When an occupancy ratio exceeds one or a reference value in each computation device, there is a possibility that control feasibility is satisfied if a control period of any logical function is increased so that the occupancy ratio does not exceed one nor the reference value. Thus, the architecture can be easily improved by outputting a proposal to lengthen the control period for a necessary logical function as a system.

Figure 13:
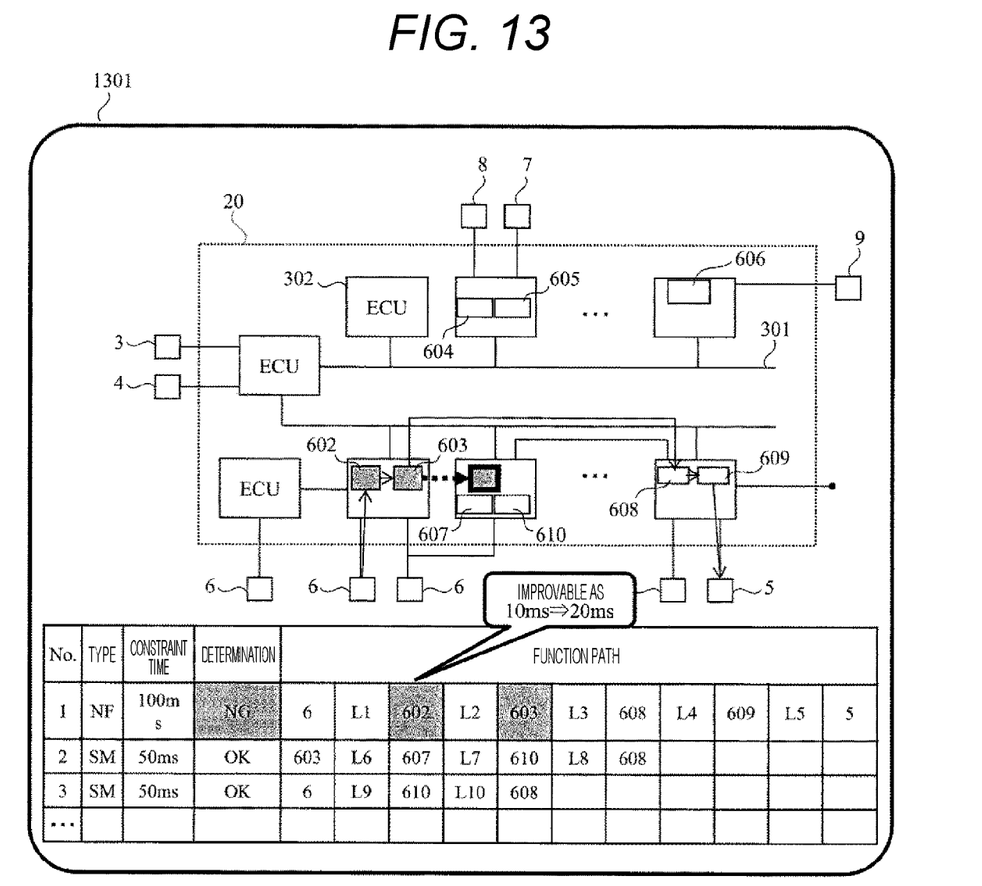
FIG. 13 is a display example of an architecture evaluation result according to a third embodiment of the present invention.

In this case, when the above-described time requirements are not satisfied by lengthening the control period, it is not the reasonable improvement. Thus, it is necessary to determine whether it is possible to lengthen the control period while satisfying all the time requirements, and only the content of which the determination in the control feasibility 105 is OK is output as an evaluation result after reviewing the control period. An output example is illustrated in FIG. 13. Here, the example is illustrated in which the occupancy rate can be set to be equal to or less than the reference value and the time requirement is satisfied by changing the control period of the logical function 602 from 10 ms to 20 ms for the evaluation result of the corresponding architecture.

For the calculation of the occupancy rate in this case, both the occupancy rate according to Formula (3) and the safety-function-prioritized occupancy rate according to Formula (4) can be used. In particular, it is possible to determine that a computation time is short and the safety function is executed even with a pessimistic value by calculating the occupancy rate using the safety-function-prioritized occupancy rate. In addition, an example of an improvement proposal by migration of the logical function will be described next. Similarly, when the occupancy rate in the computation device exceeds one or the reference value, it becomes possible for the occupancy ratio not to exceed one or the reference value by migrating some of the logical functions from a computation device to a different computation device. A migration destination candidate in this case is derived by the following formula.

[Formula 9]

$$\text{Occupancy rate margin of migration destination computation device} > \frac{\text{Execution of logical function to migrate}}{\text{Control period of logical function to migrate}} \times \frac{\text{Computation performance of migration destination computation device}}{\text{Computation performance of migration source computation device}} \quad (5)$$

The migration of the logical function to the computation device that satisfies the above formula is tried, and the migration is output as an improvement proposal when a result of the determination by the control feasibility determination unit 105 is OK again. Similarly, FIG. 13 illustrates an example of an improvement proposal in which the logical function 603 is arranged in a different ECU.

Fourth Embodiment

Figure 14:
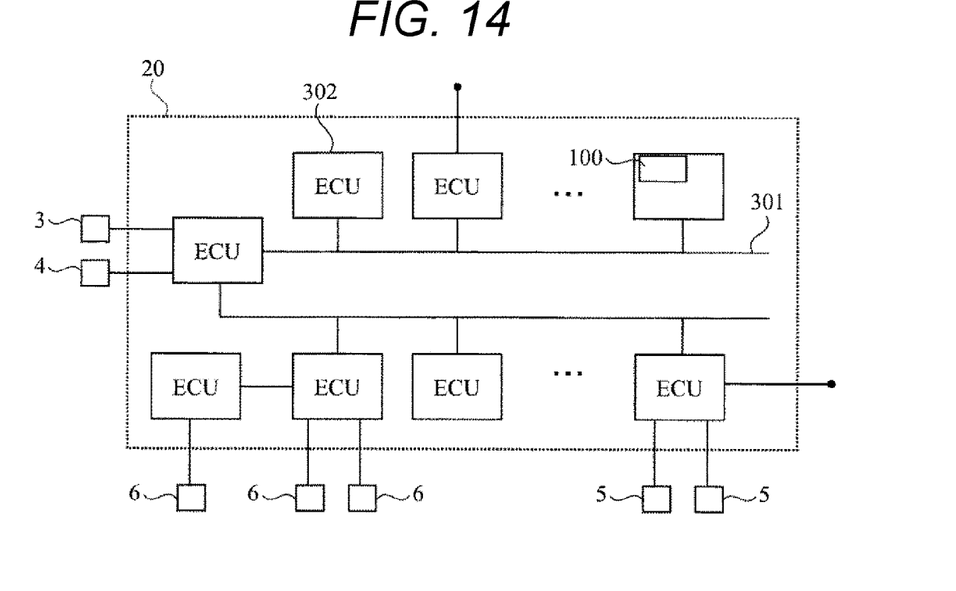
FIG. 14 is a vehicle control system according to a fourth embodiment of the present invention.

Next, a description will be given regarding an example in which vehicle control system verification is performed in a vehicle control system. A configuration of the vehicle control system in the present embodiment is illustrated in FIG. 14. The vehicle control system verification device 100 illustrated in FIG. 1 is arranged in the ECU 302, and the verification is performed in the vehicle control system.

In the present embodiment, the vehicle control system verification device 100 collects architecture information through the network 301. An example of the architecture configuration information received by the vehicle control system verification device 100 is illustrated in FIG. 15.

Figure 15:
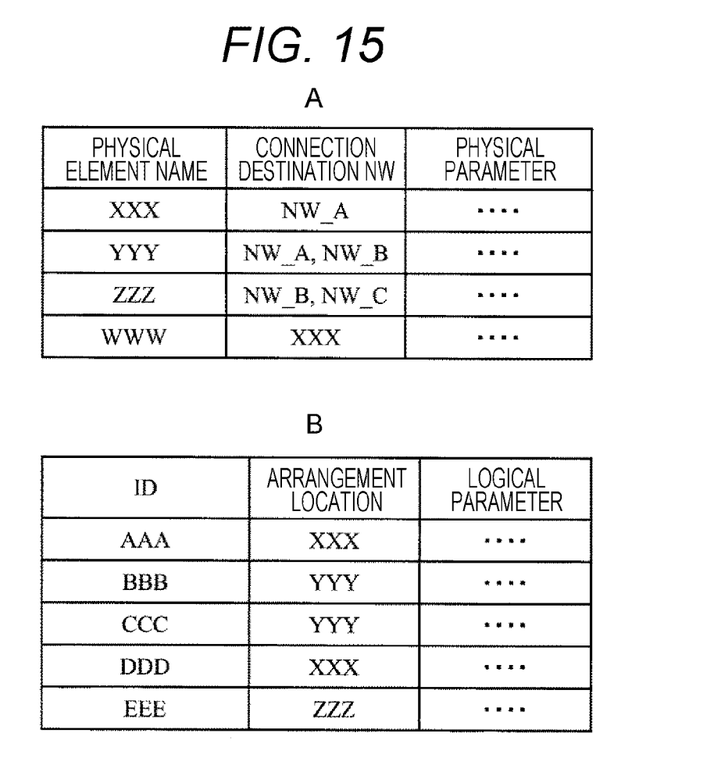
FIG. 15 is an example of architecture configuration information.

FIG. 15A illustrates physical architecture configuration information, and a name of a network connected to each physical element name (an ECU or a microcomputer) and the various parameters of the physical elements illustrated in FIG. 5 are input as information. These are suitably transmitted for the information possessed by the plurality of ECUs, the vehicle control system verification device 100 collects the information to construct physical architecture information.

FIG. 15B illustrates logical architecture configuration information, and each logical function name (ID), arranged physical element name (arrangement location), and the logical architecture parameters illustrated in FIG. 7 are input as information. These are also suitably transmitted for the information possessed by the plurality of ECUs in the same manner, the vehicle control system verification device 100 collects the information to construct logical architecture information.

These pieces of information are collected, the vehicle control system verification is performed, and the verification result is output to the network or the like. As a result, it is possible to always perform the verification on a state of the vehicle control system.

There is no need to receive the entire information for physical architecture configuration information and logical architecture configuration information acquired on the network, and only a difference may be received, and the vehicle control system verification device 100 may perform determination only by updating the difference. Then, it is possible to reduce the amount of communication.

According to the embodiment described above, included are: an arrangement unit that arranges a logical architecture, which includes a linkage of each of logical functions and an execution time constraint of the linkage, in a physical architecture; a delay time calculation unit that calculates a processing delay time based on a converted parameter when the logical architecture is arranged in the physical architecture; and a verification unit that verifies whether a total of the processing delay time satisfies the execution time constraint.

In addition, the verification unit determines whether a total processing delay time of elements of the logical architecture arranged in the physical architectures is shorter than or equal to a control period assigned to the elements of the logical architecture to verify whether the execution time constraint is satisfied.

In addition, the control feasibility of the safety function is preferentially determined for the verification.

In addition, the determination on the control feasibility uses the pessimistic execution time for the safety function execution time or the optimistic execution time for the main function execution time.

In addition, the verification device verifies the architecture based on the information on the architecture received from the outside, and transmits the verification result to the outside.

According to the embodiment described above, it is possible to efficiently determine the control feasibility based on the information on the arranged physical architecture and the information assigned to the logical architecture regarding the control feasibility when the logical architecture is arranged in the physical architecture.

In addition, in another embodiment, it is possible to perform more efficient determination by preferentially determining the safety function regarding the determination of the control feasibility for the safety-related function, and it is possible to guarantee implementation of the execution of the safety function in the pessimistic execution time and to perform the determination on the main function with expanded options by optimistic performance estimation by estimating the time required for the safety function pessimistically and the time required for the main function optimistically.

In addition, in another embodiment, it is possible to make the proposal for improvement or optimization of the architecture based on the determination result of the control feasibility.

According to yet another embodiment, the verification based on the architecture configuration information to be changed and control feasibility can be performed in the vehicle control system by performing these determinations in the vehicle control system.

REFERENCE SIGNS LIST

1 vehicle system
2 vehicle control system
3 communication device
4 vehicle control system
5 drive device
6 recognition device
7 output device
8 input device
9 notification device
100 vehicle control system verification device
101 function arrangement unit (arrangement unit)
102 safety verification unit (verification unit)
103 architecture quantitative evaluation unit 104 delay time calculation unit
105 control feasibility determination unit
300 physical architecture
301 network link
302 ECU
401 processor
402 I/O
403 timer
404 ROM
405 RAM
406 internal bus
601 logical architecture
602 integrated recognition unit
603 automatic operation control unit
604 user input unit
605 output management unit
606 notification management unit
607 abnormality detection unit
608 switching unit
609 motion control unit
610 safety control unit
1000 time requirement table
1100 benchmark score

The invention claimed is:

1. A verification device comprising:
a processor configured to:
  arrange a logical architecture, which includes a linkage of each of logical functions and an execution time constraint of the linkage, in a physical architecture;
  calculate a processing delay time based on a converted parameter when the logical architecture is arranged in the physical architecture;
  determine control feasibility of a safety function in physical elements of the physical architecture by verifying whether a total processing delay time satisfies the execution time constraint; and
  calculate a use rate of the physical elements, an occupancy rate of logical communication on a network, and a cost of the physical architecture, wherein:
  verifying whether the total processing delay time satisfies the execution time constraint includes determining:
    (i) whether the total processing delay time of elements of the logical architecture arranged in the physical architecture is less than or equal to a control period assigned to the elements of the logical architecture, and
    (ii) for each logical function arranged in each physical element, whether the occupancy rate is equal to or less than a reference value in the physical element; and
  the processor is configured such that, in response to determining that the occupancy rate exceeds the reference value, the processor reduces the occupancy ratio by at least one of lengthening the control period or migrating at least a portion of the logical functions to another processor.

2. The verification device according to claim 1, further comprising a control device, wherein
the determination on the control feasibility uses a worst case execution time for a safety function execution time or a best case execution time for a main function execution time.

3. The verification device according to claim 1, further comprising a control device, wherein
the verification device verifies an architecture based on information on the architecture received from an outside and transmits a verification result to the outside.

4. The verification device of claim 1, wherein the cost corresponds to a communication bandwidth.

* * * * *